United States Patent
Suzuki et al.

(10) Patent No.: US 6,570,134 B2
(45) Date of Patent: May 27, 2003

(54) HEAT TREATMENT DEVICE OF THE LIGHT IRRADIATION TYPE AND HEAT TREATMENT PROCESS OF THE IRRADIATION TYPE

(75) Inventors: Shinji Suzuki, Yokohama (JP); Yoshiki Mimura, Yokohama (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 78 days.

(21) Appl. No.: 09/970,928

(22) Filed: Oct. 5, 2001

(65) Prior Publication Data

US 2003/0068903 A1 Apr. 10, 2003

(51) Int. Cl.7 .................................................. F27B 5/14
(52) U.S. Cl. ...................... 219/390; 219/405; 219/411; 118/724; 118/725; 392/416
(58) Field of Search ................................ 219/390, 405, 219/411; 118/724, 725, 80.1; 392/416, 418

(56) References Cited

U.S. PATENT DOCUMENTS

| | | | | |
|---|---|---|---|---|
| 5,856,652 A | * | 1/1999 | Mayuzumi | 219/405 |
| 6,064,799 A | * | 5/2000 | Anderson et al. | 392/416 |
| 6,081,072 A | * | 6/2000 | Suzuki | 315/46 |
| 6,191,392 B1 | * | 2/2001 | Hauf et al. | 219/411 |
| 6,300,601 B1 | * | 10/2001 | Suzuki | 219/411 |
| 6,437,290 B1 | * | 8/2002 | Shao et al. | 219/390 |

* cited by examiner

Primary Examiner—Teresa Walberg
Assistant Examiner—Shawntina Fuqua
(74) Attorney, Agent, or Firm—Nixon Peabody LLP; David S. Safran (57) ABSTRACT

To enable uniform heating of the wafer and to carry out heating of the guard ring with high efficiency using lamps of a light source part formed of wafer heating lamps and guard ring heating lamps, the distance between the guard ring heating lamps and the guard ring is made larger than the distance between the wafer heating lamps and the wafer. A side wall is formed with a mirror surface is located between the lamps for wafer heating and the lamps for heating the guard ring by which the light which was emitted from the guard ring heating lamps in the direction toward the wafer are reflected toward the guard ring. Furthermore, at the outer periphery of the guard ring heating lamps, a second side wall is formed which is used as a reflection surface. In addition, at the outer periphery of the guard ring, there is a second mirror by which the light emitted outward of the guard ring is focused back onto the guard ring.

13 Claims, 8 Drawing Sheets

HEAT TREATMENT DEVICE OF THE LIGHT IRRADIATION TYPE AND HEAT TREATMENT PROCESS OF THE IRRADIATION TYPE

BACKGROUND OF THE INVENTION

1. Field of the Invention

The invention relates to a heat treatment device of the light irradiation type in which a semiconductor wafer (hereinafter called a wafer) is subjected to rapid heating, holding at a high temperature, and rapid cooling for layer formation, diffusion, baking or for similar purposes. Furthermore, the invention relates to a heat treatment process of the light irradiation type.

2. Description of Related Art

Heat treatment of the light irradiation type in the production of semiconductors, like layer formation, diffusion, baking or the like, is carried out in a wide range. In each of these treatments, a wafer is heated to a high temperature.

If a heat treatment device of the light irradiation type is used for this heat treatment, the wafer can be quickly heated and its temperature increased within a few seconds to a few dozen seconds to a temperature of at least 1000° C. When the light irradiation is stopped, it can be quickly cooled.

If, however, when the wafer is heated, the temperature distribution in the wafer ceases to be uniform, a phenomenon called slip occurs in the wafer, i.e., a dislocation defect. In this case, there is the danger that scrap will result. Therefore, in the heat treatment of the wafer using a heat treatment device of the light irradiation type it is necessary to carry out heating, holding at a high temperature, and cooling such that the temperature distribution of the wafer becomes uniform.

For example, in the case in which a wafer is heated to 1050° C., it is possible for the above described slip to form if the temperature difference within the wafer surface is 2° C. or more. To suppress formation of slip, it is desirable to keep the temperature difference within the wafer surface within 1° C.

Furthermore, when the wafer is heated for layer formation, the wafer must be heated with very precise uniformity within the surface in order to form a layer with a uniform thickness.

If the wafer is kept at a high temperature in the heat treatment device of the light irradiation type, the temperature of the peripheral area of the wafer becomes lower even if the entire surface of the wafer is irradiated with uniform irradiance. For example, a wafer is generally subjected to oxidation treatment by its being heated to roughly 1100° C. However, in the case in which the temperature of the middle area of the wafer is 1100° C., the temperature of the peripheral area becomes about 30° C. less than in the middle area; this causes the above described slip.

The reason for lowering the temperature of the peripheral area of the wafer is that heat is emitted from the side surface of the wafer. The heat emission from the side surface causes heat flow in the wafer which results in a temperature distribution. To prevent this, a process was proposed long ago in which an auxiliary material with the same heat capacity as that of the wafer is placed such that the outside periphery of the wafer is surrounded by it. This auxiliary material is generally called a guard ring.

When measures are taken so that the wafer and the guard ring can be considered a single, integral plate body, the temperature of the peripheral area of the wafer is prevented from decreasing, because the peripheral area of the wafer does not represent the peripheral area of the above described plate body, when both the wafer and also the guard ring are heated by uniform light irradiation.

Since the guard ring is arranged such that it surrounds the outer circumference of the wafer, it can also be used at the same time as the wafer holding material if it is provided with a device which holds the peripheral edge area of the wafer securely. Therefore, there are many cases in which the guard ring also has the function of holding the wafer securely.

A guard ring is specifically a component which balances the temperature drop as a result of heat emission from a side surface of the wafer or its vicinity and makes the temperature of the wafer uniform. There are also many cases in which the guard ring is used as the wafer holding material.

But it is difficult in practice to produce the guard ring such that it can be regarded as integral with the wafer (i.e., the heat capacity is made the same). The reason for this is described below.

(1) It is very difficult to produce the guard ring from the same material as the wafer. If the guard ring is produced from the same material as the wafer, i.e., from silicon (Si), the heat capacity of the wafer and the guard ring can be made the same. However, it is very difficult to process silicon into a form in which the wafer can be held securely. Furthermore, silicon is deformed when it is repeatedly exposed to a great temperature difference, by which the function as a guard ring is lost.

(2) As a material which can be processed relatively easily and which has a somewhat greater heat capacity than silicon, but a close value, there is silicon carbide (SiC). Generally silicon carbide is used for the guard ring. But, since the thickness of the silicon carbide cannot be less than 1 mm due to a problem (yield) with respect to processing, the thickness is greater than the wafer thickness of 0.7 to 0.8 mm.

(3) Due to the difference in the specific heat between silicon and silicon carbide and the difference in the thickness between the two, the heat capacity of the guard ring per unit of area is roughly 1.5 times as high as in a wafer when heated to a high temperature. Therefore, it is necessary to heat the guard ring with a greater power than the wafer in order to eliminate the above described difference of heat capacity between the wafer and the guard ring.

Figure 11:
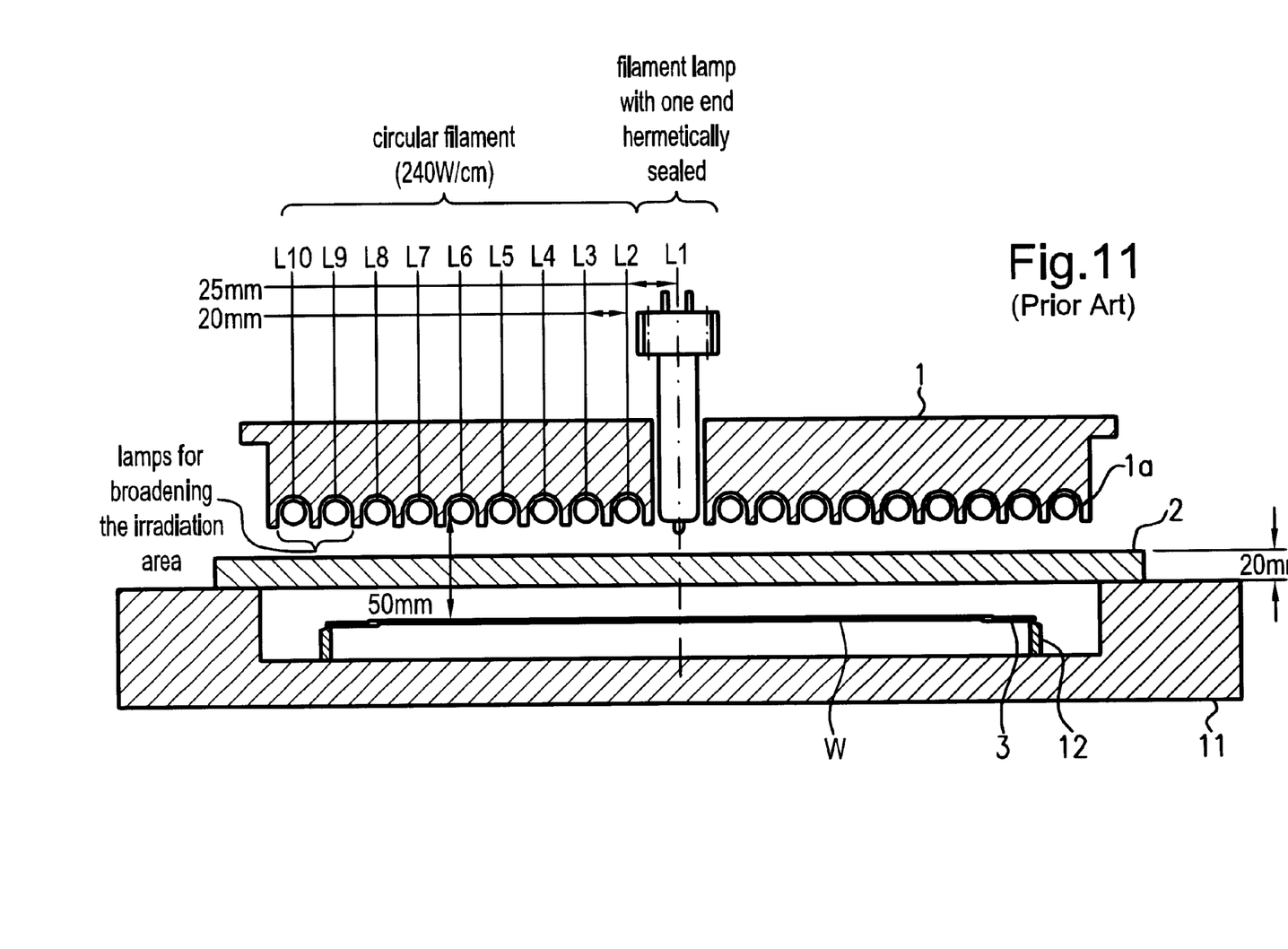
FIG. 11 shows a schematic of one example of an arrangement of a conventional heat treatment device of the light irradiation type.

FIG. 11 shows a conventional example of the arrangement of a heat treatment device of the light irradiation type. The figure shows the cross-sectional arrangement in which the heat treatment device of the light irradiation type was cut in a surface which passes through the middle of the device and intersects the wafer surface orthogonally. As is shown in FIG. 11, in a light source part 1, there are several (in this example, nine) concentrically arranged circular filament lamps L2 to L10 with different ring diameters but with the same pitch (20 mm). The ring diameter of the innermost lamp L2 is 50 mm. In order to irradiate its inner side, a lamp L1 is installed which is hermetically sealed at one end. The input power of the circular lamps L2 to L10 is, for example, 240 W/cm.

Behind the lamps L2 to L10, there is a concave-shaped mirror 1a which reflects the light from the lamps L2 to L10 onto the side of the wafer W. The light from the light source part 1 is reflected by the lamps L1 to L10 directly or by the mirror 1a and is emitted via a quartz window 2 (in this example, with a thickness of 20 mm) onto the wafer which is placed on the guard ring 3. The distance between the lamps L1 to L10 and the wafer W, in this example, is 50 mm.

The guard ring 3 is held securely by a holding member 12 which is located in a chamber 11, and at the same time, has the function of the wafer holding material.

As shown in FIG. 11, in the light source part 1, there are not only the lamps L1 to L8 which irradiate the area in which the wafer W is present, but also lamps L9 and L10 which are used for broadening the light irradiation area. The guard ring 3 is also heated by light irradiation. The guard ring 3 is produced by the above described processing of silicon carbide and has a heat capacity roughly 1.5 times as high as that of the wafer, as was described above. Therefore, the input power of the lamps L9 and L10 has been increased so that their output power is increased, and the attempt is made to emit a large amount of radiant energy onto the guard ring 3 in order to eliminate the above described difference of heat capacity.

The light from the lamps L9 and L10 for broadening of the above described light irradiation area is, however, emitted broadened. Therefore, it is emitted not only onto the guard ring 3, but also onto the wafer W. When the output power of the lamps L9 and L10 is increased and thus radiated, therefore the temperature of the wafer W increases, by which heating with a uniform temperature becomes difficult.

Furthermore, even if the output power of the lamps L9 and L10 is increased, it is difficult to supply radiant energy to the guard ring with high efficiency which is sufficient for eliminating the difference of heat capacity between the wafer W and the guard ring 3 because the emitted light broadens. The temperature of the guard ring 3 is therefore lowered in a wide area in which the wafer W is in contact with the guard ring 3 in a discontinuous way; this causes slip.

If the output power of the lamps L9 and L10 is increased, the irradiance is also increased in the area of the guard ring 3. However, since the wafer W is also irradiated, the irradiance in the wafer edge area is increased. The temperature of the wafer W is therefore increased in the direction toward its edge area. On the other hand, the light from the lamps L9 and L10 is broadened, by which the guard ring 3 cannot acquire any energy which balances the above described difference of heat capacity. The temperature is therefore lowered in the area in which the wafer W is in contact with the guard ring 3 in a discontinuous manner; in this way, slips occurs in the peripheral area in which the temperature is not uniform.

To make available the energy which is used to balance the difference of the heat capacity between the wafer W and the guard ring 3, the input power for the lamps L9 and L10 must be increased even more; this is not effective.

SUMMARY OF THE INVENTION

The invention was devised to eliminate the above described defect in the prior art. The primary object of the invention is to enable uniform heating of the wafer, and moreover, to heat the guard ring with high efficiency by focusing the light from the lamps for heating the guard ring only on the guard ring.

The object is achieved as follows:

(1) In a heat treatment device of the light irradiation type which comprises:

a light source part in which there are several concentrically arranged circular filament lamps with different ring diameters, and in which there is a mirror behind the above described filament lamps;

a wafer located on the side opposite the mirror; and a guard ring which is located in the peripheral area of the wafer in that the above described several filament lamps of the light source part are comprised of a first lamp group located opposite the wafer and of a second lamp group located opposite the guard ring on the outer periphery of the first lamp group so that the light emitted from the second lamp group is not radiated onto the wafer, that furthermore the distance between the lamps in the second lamp group and the guard ring in the direction of light irradiation (in the direction perpendicular to the wafer surface) is made larger than the distance between the lamps of the first lamp group and the wafer in the direction of light irradiation (in the direction perpendicular to the wafer surface), and furthermore, that the side wall formed between the second lamp group and the first lamp group has a mirror surface by which the light which has been emitted from the lamps of the second lamp group and which faces toward the wafer is reflected in the direction toward the guard ring.

This prevents the light from being emitted from the lamps of the second lamp group onto the wafer. The light corresponding to this amount can be focused on the guard ring.

(2) In the above described approach (1), on the outermost outer periphery of the second lamp group, a second side wall is formed which extends in the direction which opens with respect to the direction of light irradiation, and which reflects the light emitted from the second lamp group in the direction toward the above described guard ring.

This means that a second side wall is formed which is provided in a direction with an angle which opens with respect to the direction in which the outer periphery of the second lamp group is irradiated with light. This side wall is used as the reflection surface. In this way, the light which is emitted from the lamps of the second lamp group in the direction toward the outside of the guard ring can be focused on the guard ring and the radiant energy emitted onto the guard ring can be increased.

(3) In the above described approaches (1) and (2), on the outside periphery of the guard ring there is a second mirror which reflects the light emitted from the second lamp group in the direction to the guard ring.

This means that, on the outer periphery of the guard ring, there is a second mirror which in one direction is provided with an angle which opens with respect to the direction of the light source part. In this way, the light emitted onto the outer side of the guard ring can be focused on the guard ring and thus, the radiant energy emitted onto the guard ring can be increased.

The embodiments of the invention are further described in detail below with reference to the accompanying drawings.

DETAILED DESCRIPTION OF THE INVENTION

Figure 1:
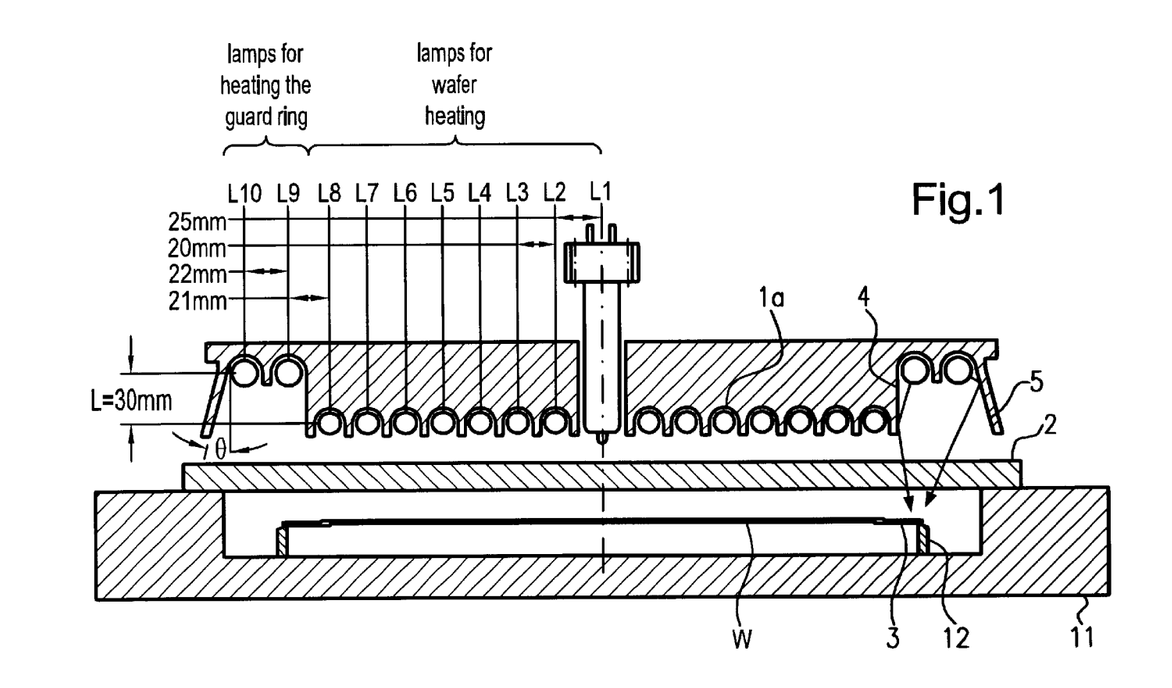
FIG. 1 is a schematic of the cross-sectional arrangement of one embodiment of a heat treatment device of the light irradiation type in accordance with the invention.
Figure 2:
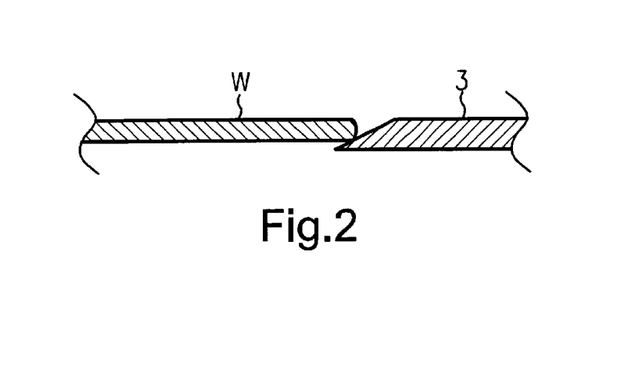
FIG. 2 shows a schematic of the area in which a wafer is held by a guard ring.

FIG. 1 shows an embodiment of the cross-sectional arrangement of a heat treatment device of the light irradiation type in accordance with the invention. In the figure, a light source part 1 contains lamps L1 to L8 for wafer heating, with a shape, arrangement pitch, input power and the like which are identical to the conventional example shown in FIG. 11 described above. Furthermore, a quartz window 2 is located below the lamps and a guard ring 3 is held by a holding member 12 which is located in a chamber 11. A wafer W is seated on the guard ring 3. The guard ring 3 thus, at the same time, also has the function of a wafer holder. The area of the guard ring 3 in which the wafer W is held, as is shown for example in FIG. 2, is beveled. The guard ring 3 and the edge area of the wafer W are linearly in contact with one another.

Lamps L9 and L10 are lamps for heating the guard ring 3. The input power of the lamps L9 and L10 is 300 W/cm and is therefore greater than that of lamps L1 to L8 for wafer heating. Since the tube diameter becomes somewhat larger, the arrangement pitch between the lamps L8 and L9 is, for example, 21 mm and between the lamps L9 and L10 it is, for example, 22 mm. Furthermore, the lamps L9–L10 are located, for example, 30 mm farther away from the wafer W than the distance between the lamps L2–L8 and the wafer W (e.g., 50 mm).

The above described arrangement, as shown in FIG. 1, yields a side wall 4 (which is called the first side wall) between the lamp L8 for wafer heating and the lamp L9 for heating of the guard ring. Because the side wall 4 is made into a reflection surface, the light emitted from the lamps L9 and L10 for heating of the guard ring in the direction to the wafer W is reflected in a direction toward the guard ring 3.

In this way, the light is not radiated onto the wafer even if the input power of the lamps L9 and L10 is increased. Therefore, the wafer temperature does not increase. Uniform heating is enabled by controlling the lamps for wafer heating. Furthermore, since the light which is conventionally radiated in the direction to the wafer W is reflected onto the guard ring 3, the energy of the light radiated onto the guard ring 3 becomes greater than in the conventional device. As a result, the guard ring 3 can be heated with high efficiency.

Additionally, in the outside peripheral area of the lamp L10 which is located on the outermost side from the lamps for heating the guard ring, there is a second side wall 5 with a reflection surface which is located with an angle $\theta$ so that the reflection surface projects outwardly with respect to the direction of light irradiation (with respect to the direction perpendicular to the wafer surface). The angle $\theta$ is the angle of the reflection surface of the second side wall 5 with respect to the direction of light irradiation. Thus, light that is emitted outwardly from the lamps L9 and L10 is reflected by the second side wall 5 in the direction to the guard ring 3.

The light which has been conventionally emitted in an outward direction and which has not contributed to heating of the guard ring 3 is reflected by the above described arrangement in the direction toward the guard ring 3. In this way, the energy of the light irradiating the guard ring 3 is increased relative to prior art devices. Therefore, the guard ring 3 can be heated with high efficiency.

In FIG. 1, the shape of the cross section of the reflection surface of the second side wall 5 is straight. However, the shape of the cross section can also be curved, such as oval, parabolic or the like, so that the light emitted from the lamps L9 and L10 is focused onto the guard ring 3.

In the embodiment as shown in FIG. 1, the guard ring 3 also has the function of a wafer holder. But, there can also be wafer holder in addition, and thus, it can hold the wafer W securely.

Figure 3:
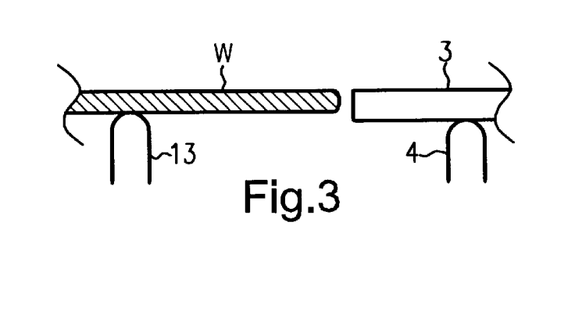
FIG. 3 is a schematic of one example of the arrangement in which there is a guard ring on the wafer periphery and the wafer is held by a holding member.

As shown in FIG. 3, in the vicinity of the peripheral area of the wafer W there is the guard ring 3, and the wafer W and the guard ring 3 are held each by a respective holder 13 and 14, for example by a three-point holding device. Since the wafer W bends under its own weight, the above described holder 13 is located at a point at which the amount of bending of the wafer W is as small as possible.

Figure 4:
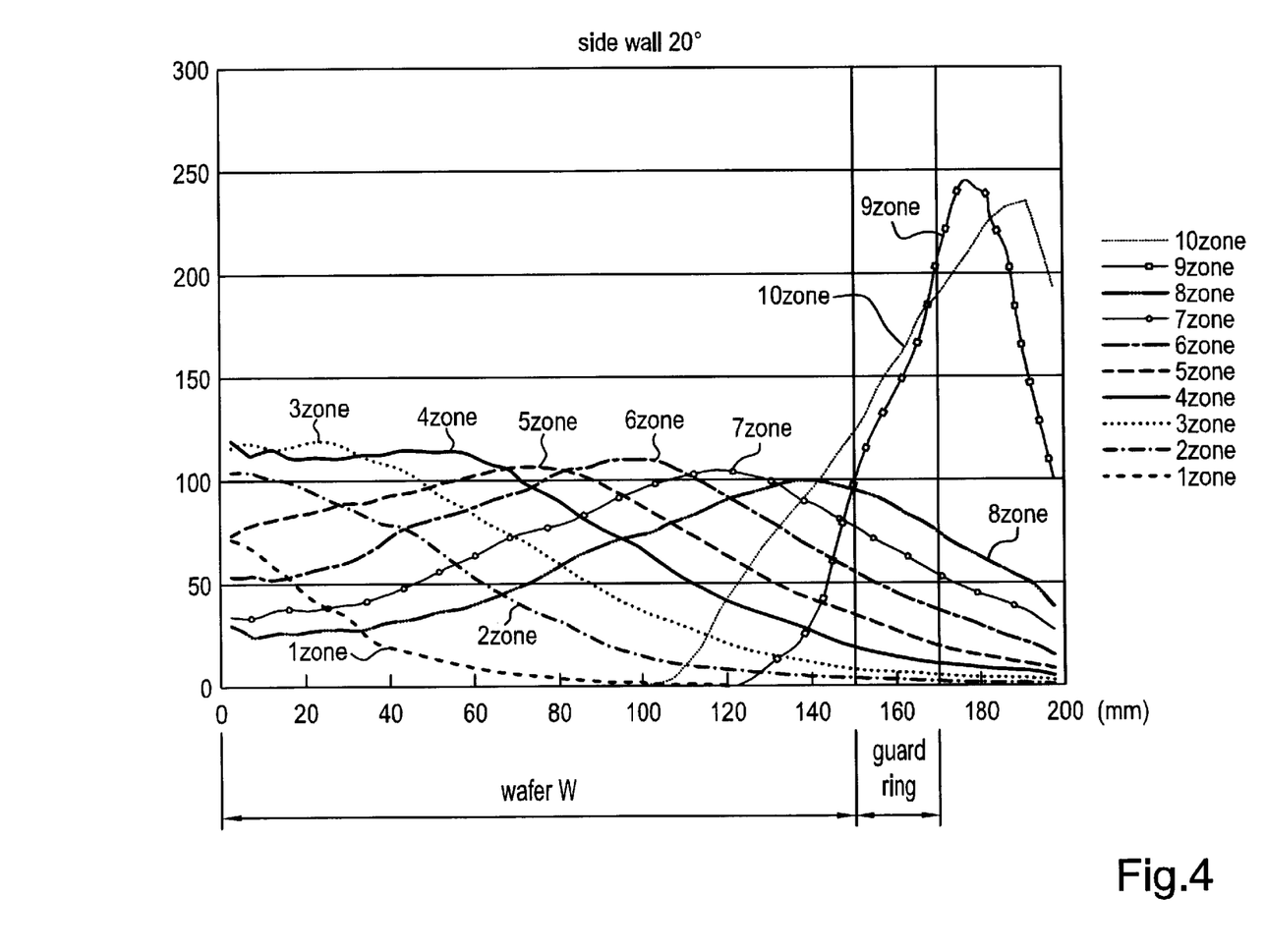
FIG. 4 is a graph of the size and the distribution of the irradiance irradiated onto the wafer and the guard ring surface (in the case in which the side wall angle $\theta=20°$) in the arrangement as shown in FIG. 1.

FIG. 4 represents the magnitude and distribution of the irradiance emitted onto the wafer and the guard ring surface in the above described arrangement having the first side wall 4 and the second side wall 5. Here, the x-axis plots the horizontal distance (mm) from the center of the wafer, while the y-axis plots the relative values of the irradiance emitted onto the wafer and the guard ring surface. The area from 0 to 150 mm of the x-axis designates the area of the wafer W, and the area from 150 mm to 170 mm of the x-axis designates the area of the guard ring 3. The irradiance in the figure was determined by computation.

FIG. 4 shows a case in which the angle $\theta$ of the second side wall 5 is 20°. As was shown in FIG. 1, eight lamps L1 to L8 were used as lamps for wafer heating and two lamps L9 and L10 were used for heating of the guard ring.

The respective curve in FIG. 4 shows to what area the light from the respective lamps L1 to L10 broadens and is emitted. In the figure, the 1 zone represents the size and the distribution of the irradiance emitted from the lamp L1. Furthermore, the zones 2 zone to 10 zone represent the size and the distribution of the irradiance emitted from the lamps L2 to L10.

For example, the light from the lamp L6 in the 6 zone, in the area which extends up to roughly 150 mm from the middle of the wafer W (the middle being the position located directly underneath the lamp), has the peak of irradiance in the middle of the wafer W and the irradiance spreads outward in a broad area from the middle of the wafer W as far as the outer side of the guard ring 3. Not only the light of the 6 zone, but also the light from the wafer heating lamps L1 to L8 of the 1 to 8 zones, is emitted in a wide area.

On the other hand, the light from the guard ring heating lamps L9 and L10 in the 9 and 10 zones have their peak of irradiance in the area between the middle of the wafer W and the outer side of the guard ring, the guard ring 3 being located 160 mm from the middle of the wafer. The amount radiated onto the wafer W is low. In particular, this light is not emitted inwardly beyond 100 mm from the middle of the wafer W.

Therefore, heating of the wafer W can be minimized even if the output power of the lamps L9 and L10 of the 9 and 10 zones is increased. Thus, in the state in which the temperature within the surface of the wafer W is kept uniform, only the guard ring 3 can be heated and the difference of the heat capacity between the wafer W and the guard ring 3 can be equalized.

Figure 5:
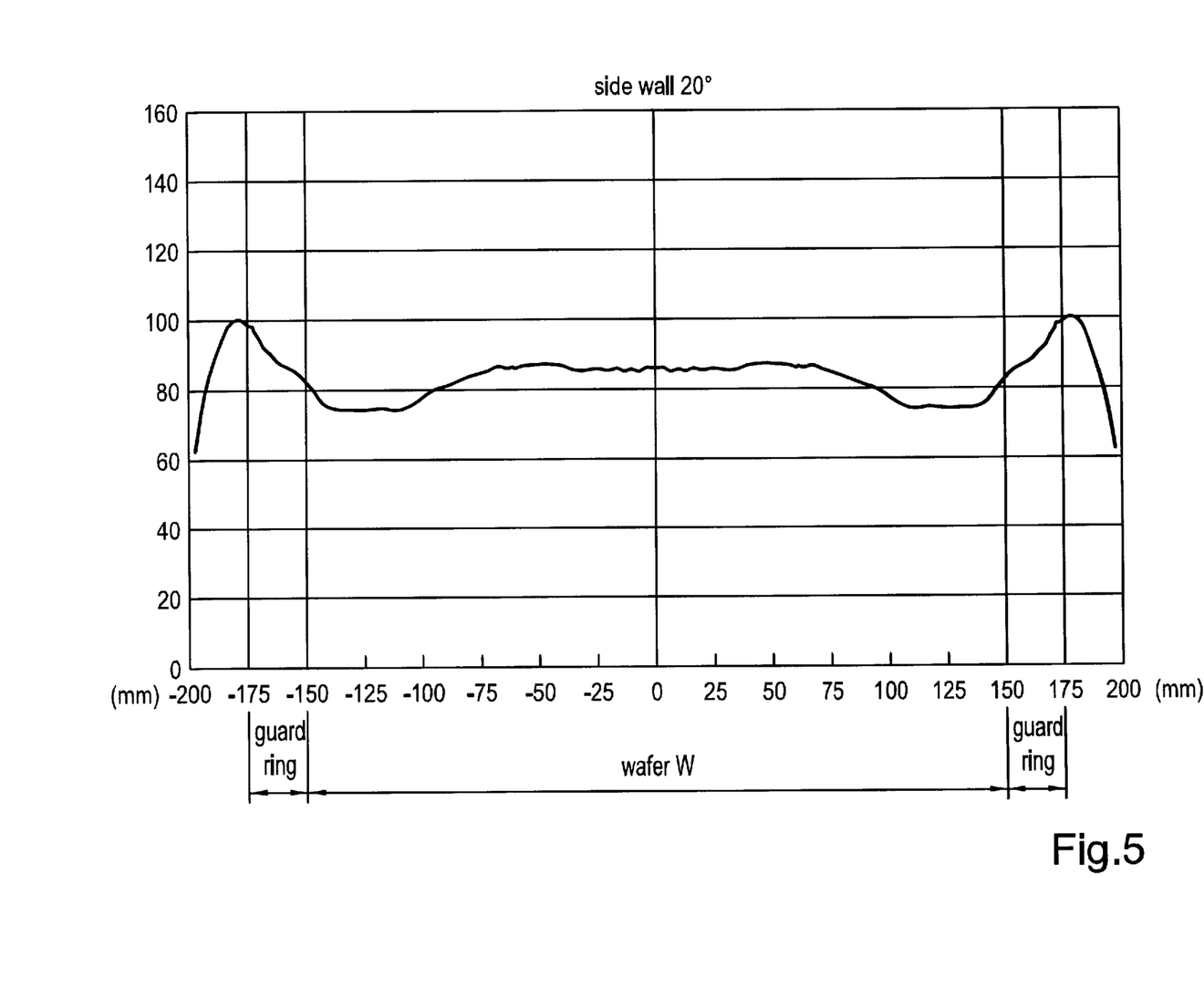
FIG. 5 is a graph in which the irradiance of the lamps L1 to L10 was added under the conditions shown in FIG. 4.

FIG. 5 shows the cumulative irradiance of the lamps L1 to L10, i.e., the irradiance of all of the lamps was added, under the conditions as shown in FIG. 4. As in FIG. 4, here, the x-axis plots the horizontal distance (mm) from the middle of the wafer. The middle axis in FIG. 5 represents the wafer middle. The y-axis plots the relative values of the irradiance emitted onto the wafer and the guard ring surface. The area of the wafer W is the range from 0 ±150 mm of the x axis, while the area from ±150 mm to ±170 mm is the area of the guard ring 3.

The drawings show that essentially uniform radiant energy is emitted within the area of the wafer W and that high irradiance can be applied to only the guard ring 3 by means of the arrangement of the first side wall 4 and the second side wall 5.

In the case in which the arrangement of the lamps L9 and L10 of the 9 zone and 10 zone and the mirror shape are identical to the conventional example in FIG. 11, outside the 8 zone, the curves for lamps L9 and L10 would be like the curves for the lamps L1 to L8 of the 1 to 8 zones. The light from the lamps L9 and L10 of the 9 and 10 zones is emitted as far as the middle area of the wafer. In this case, heating takes place as far as to the area on the inside of the wafer W, and the temperature rises when the input power of the lamps L9 and L10 of the 9 and 10 zones is increased to heat the guard ring.

Figure 6:
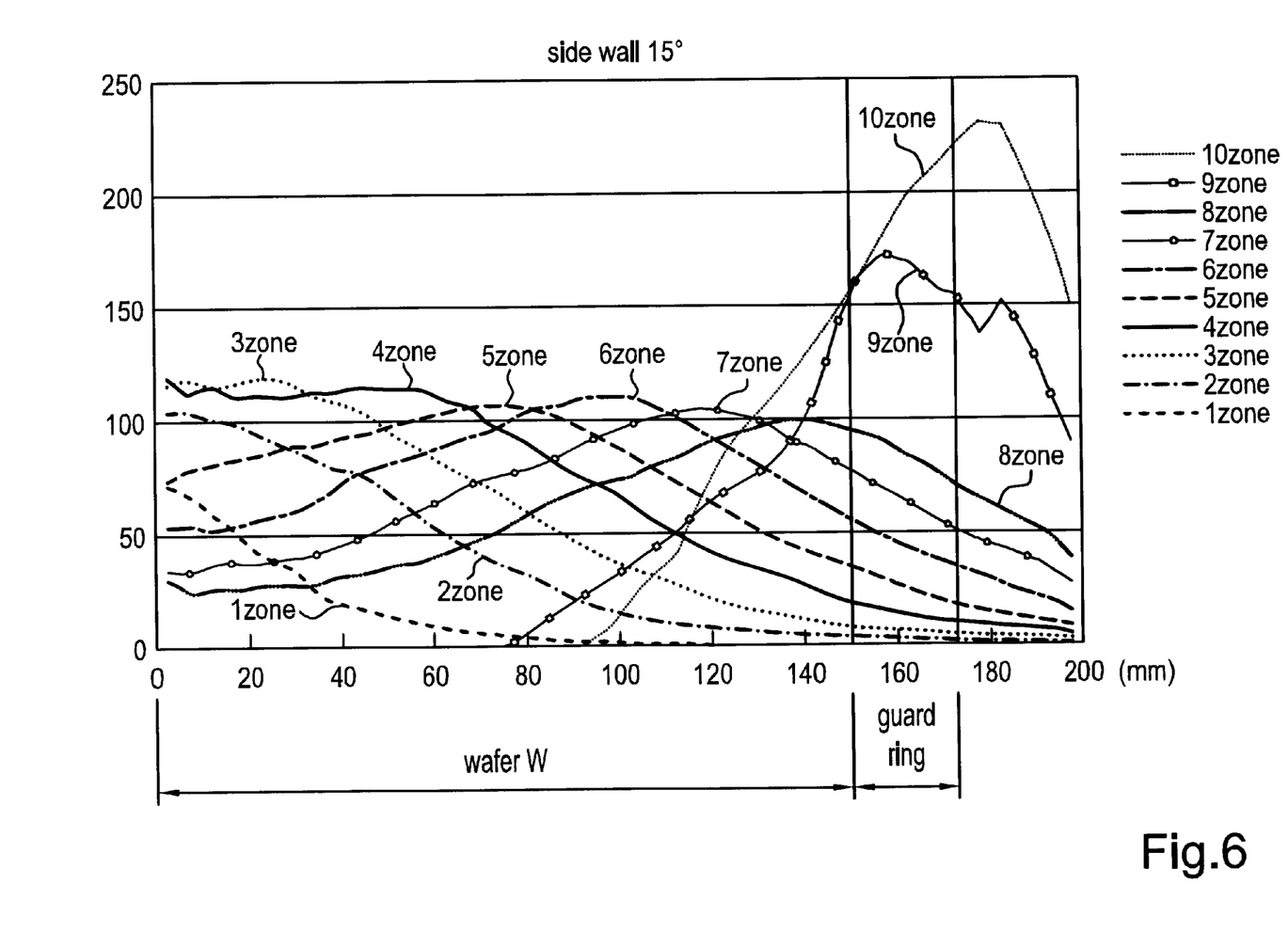
FIG. 6 shows a graph of the size and the distribution of the irradiance irradiated onto the wafer and the guard ring surface (in the case in which $\theta=15°$) in the arrangement as shown in FIG. 1.

FIG. 6 is a schematic of the size and the distribution of the irradiance in the case in which the angle θ of the second side wall 5 is 15°. As in FIG. 4, here the x-axis plots the horizontal distance (mm) from the center of the wafer, while the y-axis plots the relative values of the irradiance emitted onto the wafer and the guard ring surface. The area from 0 to 150 mm of the x-axis designates the area of the wafer W, and the area from 150 mm to 170 mm of the x-axis designates the area of the guard ring 3.

As FIGS. 4 & 6 show that, by changing the angle θ of the second side wall 5, the distribution of the irradiation by the lamps for the heating of the guard ring L9 and L10 can be changed without changing the distribution of the irradiation by the lamps for wafer heating L1 to L8. By suitable adjustment of the above described angle θ, the amount of light emitted onto the wafer W from the lamps L9 and L10 for heating of the guard ring can be reduced and the amount of light emitted onto the guard ring 3 from the lamps L9 and L10 for heating the guard ring can be increased.

Furthermore, by changing not only the angle θ of the second side wall 5, but also the height of the first side wall 4 and the second side wall 5, the distribution of the irradiation by the lamps L9 and L10 for heating the guard ring can be changed.

Figure 7:
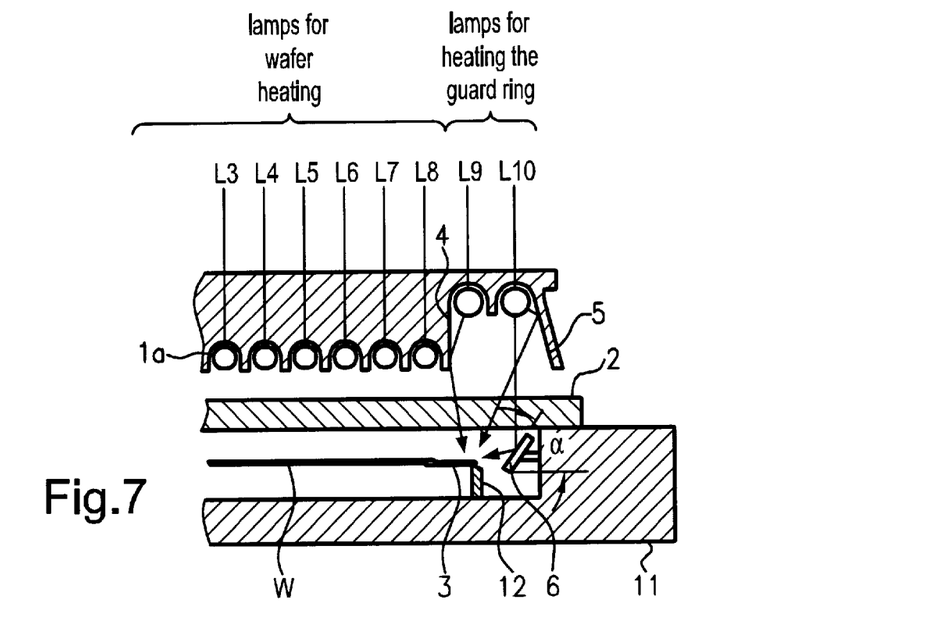
FIG. 7 shows a schematic of an embodiment of the arrangement in which there is a second mirror on the periphery of the guard ring.

To increase the energy of the light irradiating the guard ring, in the periphery of the guard ring, there is a second mirror 6 as is shown in FIG. 7. This second mirror 6 has an angle α with respect to a direction parallel to the wafer surface on which light projects from the light source part and which is perpendicular to the direction of light irradiation. The second mirror 6 is located around the entire periphery of the guard ring.

The second mirror 6 reflects the light emitted from the guard ring heating lamps L9 and L10 in a direction onto the outer edge of the guard ring 3. The light which was emitted conventionally to the side of the guard ring 3 and which did not contribute to heating of the guard ring 3 is reflected in the direction to the guard ring 3 by the arrangement of the second mirror 6. The energy of the light which irradiates the guard ring 3 increases. Thus, the guard ring 3 can be heated with high efficiency.

Figure 8:
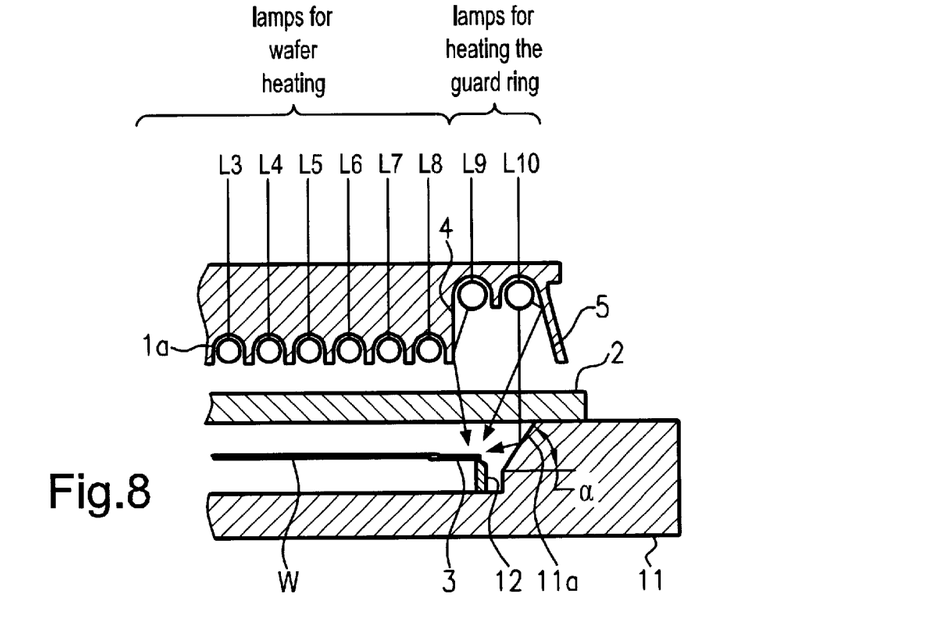
FIG. 8 is a schematic view of an embodiment of the arrangement in which the chamber is provided with an inclined plane instead of the arrangement of a second mirror.

Furthermore, instead of the arrangement of the second mirror 6, the chamber 11 can be provided with an inclined planar surface 11a and this inclined planar surface 11a can be used as a reflection surface, as is shown in FIG. 8.

Figure 9:
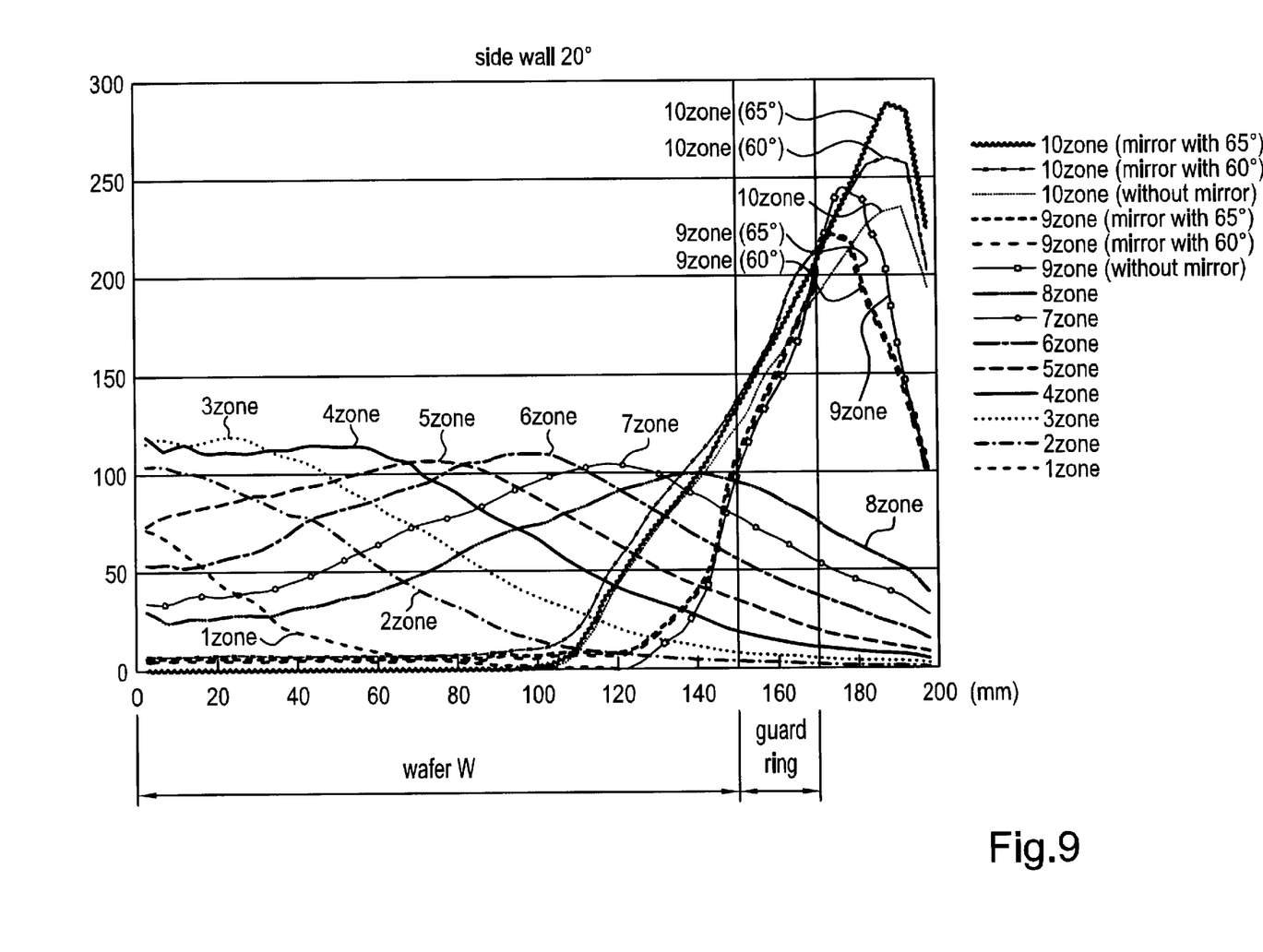
FIG. 9 is a graph of the size and the distribution of the irradiance emitted onto the wafer and the guard ring surface (in the case in which $\theta=20°$) in the case of the arrangement of the second mirror in the arrangement as shown in FIG. 1.

FIG. 9 is a graph of the magnitude and distribution of the irradiance in an arrangement of the first side wall 4, the second side wall 5 with an angle θ of 20° and of the second mirror 6. As in FIG. 4, here, the x-axis plots the horizontal distance (mm) from the center of the wafer, while the y-axis plots the relative values of the irradiance radiated onto the wafer and the guard ring surface. The area from 0 to 150 mm of the x-axis designates the area of the wafer W, and the area from 150 mm to 170 mm of the x-axis designates the area of the guard ring 3. In FIG. 9, the size and the distribution of the irradiance are in cases in which the angle α of the second mirror 6 is 60° and 65° and in which there is no second mirror 6.

As is apparent from FIG. 9, by providing a second mirror 6, the distribution of the irradiation by the guard ring heating lamps L9 and L10 can be changed without changing the distribution of the irradiation by the lamps L1 to L8 for wafer heating. By suitable adjustment of the above described angle a the amount of light irradiating the guard ring 3 from the lamps L9 and L10 for heating of the guard ring can be changed.

Figure 10A:
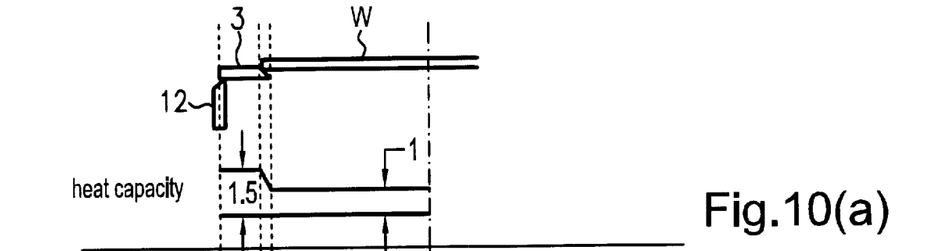
FIGS. 10(a)–10(d) show representations of the distributions of the irradiance emitted onto the wafer and the guard ring and the temperature in a conventional example and in accordance with the invention.
Figure 10B:
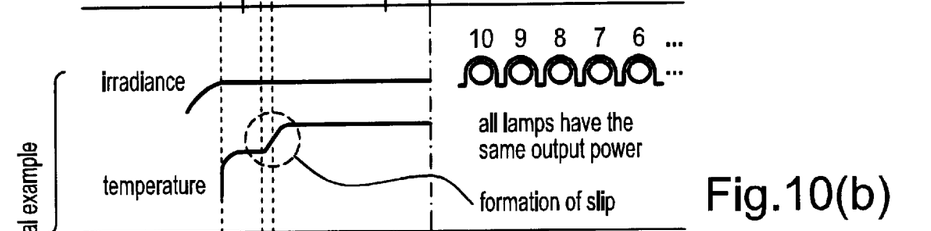

FIGS. 10(a) to 10(d) show the distributions of the irradiance emitted onto the wafer and the guard ring and the temperature in a conventional example and with the invention. FIG. 10(a) schematically shows the positions of the wafer W, of the guard ring 3 and of the holding material 12 and the change of the heat capacity. As was described above, the guard ring 3 has a heat capacity which differs by a factor of roughly 1.5 as compared to the wafer. FIG. 10(b) shows the irradiance and the temperature in the case in which the output power of the lamps L1 to L10 was made the same as in the conventional lamp arrangement which is shown in FIG. 11. The irradiance is made uniform from the wafer W to the guard ring 3. On the other hand, the temperature becomes uniform since, within the wafer area, the heat capacity is the same. However, the temperature drops in a discontinuous manner in the area of the wafer W which is in contact with the guard ring 3 that has a larger heat capacity; this leads to a corresponding decrease of the temperature in the peripheral area of the wafer W. As a result, slip occurs in the peripheral area of the region in which the temperature has dropped.

Figure 10C:
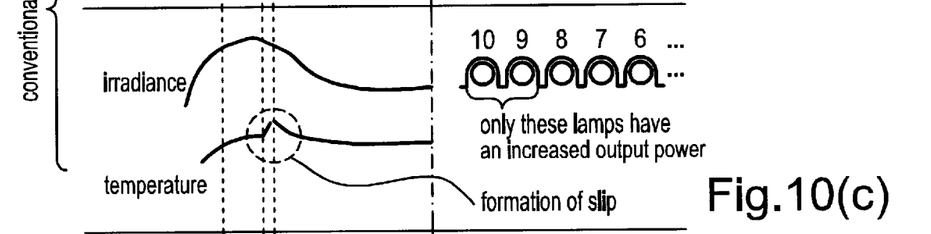

FIG. 10(c) shows the irradiance and the temperature in the case in which only the output power of the lamps L9 and L10 was increased in the conventional lamp arrangement shown in FIG. 11. But, since the wafer W is also irradiated, the irradiance on the periphery of the wafer W becomes large. Therefore, the wafer temperature is higher in the direction toward the peripheral area. However, since the light from lamps L9 and L10 broadens and since energy which is sufficient for balancing the difference of the heat capacity compared to the guard ring 3 is not obtained, the temperature drops in the area which is in contact with the guard ring in a discontinuous manner. Slip occurs in the peripheral area with this nonuniform temperature.

Figure 10D:
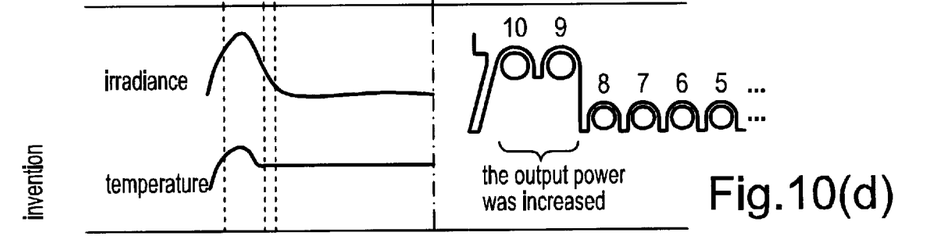

FIG. 10(d) shows a case of the lamp arrangement and mirror arrangement in accordance with the present invention. Here, light from the lamps L9 and L10 with a high output power can be concentrated on the guard ring 3. Therefore, the irradiance becomes high only in the guide ring. In this way, energy sufficient for equalizing the heat capacity difference can be supplied only to the guard ring 3. Thus, the temperature from the wafer W to the guard ring 3 can be made uniform. As a result, slip can be prevented in the peripheral area of the wafer. Furthermore, even when heating to form layers, heating can be uniformly produced so that a layer with a uniform thickness can be formed.

Action of the Invention

As was described above, the following effects can be obtained in accordance with the invention:

(1) By the measure that the light emitted from the lamps for heating the guard ring is prevented from being radiated onto the wafer, the wafer temperature does not rise. Controlling the lamps for heating of the wafer enables uniform heating of the wafer. Specifically, according to the invention, the distance between the lamps for heating the guard ring and the guard ring is made greater than the distance between the lamps for wafer heating and the wafer, there is a side wall of a mirror between the lamps for heating the guard ring and the lamps for wafer heating, and thus, the light emitted from the lamps for heating the guard ring is prevented from being radiated onto the wafer. By means of this measure, the light from the lamps for heating the guard ring is not radiated onto the wafer, even if the input power thereof is increased. The wafer temperature therefore does not increase. Controlling the lamp for wafer heating enables uniform heating.

(2) Furthermore, since the light which has been conventionally radiated in the direction toward the wafer is reflected in the direction toward the guard ring, the energy of the light radiated onto the guard ring is increased. Therefore, the guard ring can be heated with high efficiency. In this way, the heat capacity between the wafer and the guard ring can be balanced with high efficiency.

(3) The guard ring can be heated with higher efficiency by the measure that the outside periphery of the guard ring heating lamps is provided with a second side wall and that the light emitted in the direction toward the outer periphery of the guard ring is radiated onto the guard ring.

(4) The light emitted toward the side of the guard ring is reflected onto the guard ring by the arrangement of a second mirror in the area of the outer periphery of the guard ring. In this way, the guard ring can be heated with higher efficiency.

(5) By combination of the above described measures the wafer can be optically heated with a uniform temperature. Thus, slip can be prevented from forming in the wafer. Furthermore, even when heating to form layers heating can be produced uniformly. Thus, a layer with a uniform thickness can be formed.

While various embodiments in accordance with the present invention have been shown and described, it is understood that the invention is not limited thereto. These embodiments may be changed, modified and further applied by those skilled in the art. Therefore, this invention is not limited to the details shown and described previously, but also includes all such changes and modifications which are encompassed by the appended claims.

What we claim is:

1. Heat treatment device of the light irradiation type which comprises:

a light source part having a plurality concentrically arranged circular filament lamps of different ring diameters and a mirror located behind said filament lamps;

a wafer located on a side of said lamps that is opposite said mirror; and a guard ring which is located in a peripheral area of the wafer;

wherein said filament lamps of the light source part are composed of a first lamp group located opposite the wafer and of a second lamp group located opposite the guard ring at an outer periphery of the first lamp group; wherein a distance between the lamps in the second lamp group and the guard ring in a direction of light irradiation is larger than a distance between the lamps of the first lamp group and the wafer in the direction of light irradiation; and wherein a side wall is provided between the second lamp group and the first lamp group.

2. Heat treatment device of the light irradiation type as claimed in claim 1, wherein the side wall is made reflective and as part of the mirror.

3. Heat treatment device of the light irradiation type as claimed in claim 1, wherein a second side wall is provided at an outermost outer periphery of the second lamp group which is arranged so as to reflect light emitted from the second lamp group toward the guard ring.

4. Heat treatment device of the light irradiation type as claimed in claim 2, wherein a second side wall is provided at an outermost outer periphery of the second lamp group which is arranged so as to reflect light emitted from the second lamp group toward the guard ring.

5. Heat treatment device of the light irradiation type as claimed in claim 4, wherein the second side wall provided between the second lamp group and the first lamp group is made as part of the mirror.

6. Heat treatment device of the light irradiation type as claimed in claim 3, wherein the second side wall provided between the second lamp group and the first lamp group is made as part of the mirror.

7. Heat treatment device of the light irradiation type as claimed in claim 1, wherein a second mirror is positioned in an area of an outer periphery of the guard ring so as to reflect light emitted from the second lamp group toward the guard ring.

8. Heat treatment device of the light irradiation type as claimed in claim 2, wherein a second mirror is positioned in an area of an outer periphery of the guard ring so as to reflect light emitted from the second lamp group toward the guard ring.

9. Heat treatment device of the light irradiation type as claimed in claim 3, wherein a second mirror is positioned in an area of an outer periphery of the guard ring so as to reflect light emitted from the second lamp group toward the guard ring.

10. Heat treatment device of the light irradiation type as claimed in claim 4, wherein a second mirror is positioned in an area of an outer periphery of the guard ring so as to reflect light emitted from the second lamp group toward the guard ring.

11. Heat treatment device of the light irradiation type as claimed in claim 5, wherein a second mirror is positioned in an area of an outer periphery of the guard ring so as to reflect light emitted from the second lamp group toward the guard ring.

12. Heat treatment device of the light irradiation type as claimed in claim 6, wherein a second mirror is positioned in an area of an outer periphery of the guard ring so as to reflect light emitted from the second lamp group toward the guard ring.

13. Process for heat treatment with light irradiated from a plurality of filament lamps onto a wafer, said filament lamps being arranged in a first lamp group and a second lamp group, comprising the steps of:

supporting a peripheral area of a wafer to be heat-treated by being irradiated with light from said plurality of filament lamps on a guard ring which has a heat capacity which is different from that of the wafer, locating the first lamp group of said filament lamps opposite the wafer and the second lamp group of said filament lamps opposite the guard ring wherein a distance between the lamps in the second lamp group and the guard ring in a direction of light irradiation is larger than a distance between the lamps of the first lamp group and the wafer in the direction of light irradiation; and heat treating the wafer with light irradiated from the first lamp group while diverting the light emitted from the second lamp group away from the wafer and toward the guard ring.

* * * * *